(12) United States Patent
Duvvury et al.

(10) Patent No.: US 6,826,026 B2
(45) Date of Patent: Nov. 30, 2004

(54) OUTPUT BUFFER AND I/O PROTECTION CIRCUIT FOR CMOS TECHNOLOGY

(75) Inventors: Charvaka Duvvury, Plano, TX (US); Roger A. Cline, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 352 days.

(21) Appl. No.: 10/213,386

(22) Filed: Aug. 6, 2002

(65) Prior Publication Data

US 2003/0048588 A1 Mar. 13, 2003

Related U.S. Application Data

(60) Provisional application No. 60/318,046, filed on Sep. 7, 2001.

(51) Int. Cl.[7] .................................................. H02H 9/00

(52) U.S. Cl. ....................................................... 361/56

(58) Field of Search ............................................ 361/56

(56) References Cited

U.S. PATENT DOCUMENTS

| | | | | |
|---|---|---|---|---|
| 4,775,809 A | * | 10/1988 | Watanabe | 326/87 |
| 5,510,728 A | * | 4/1996 | Huang | 326/30 |
| 6,444,511 B1 | * | 9/2002 | Wu et al. | 438/199 |

* cited by examiner

Primary Examiner—Brian Sircus
Assistant Examiner—James A Demakis
(74) Attorney, Agent, or Firm—W. James Brady, III; Frederick J. Telecky, Jr.

(57) ABSTRACT

An output circuit for improved ESD protection (FIG. 2) comprising a pMOS pull-up output transistor connected between a signal (I/O) pad 220 and Vdd power supply 240, the pull-up transistor located in a n-well 203 and having at least one gate 210, the gate connected to internal circuitry 230. A dummy pMOS transistor connected in parallel with the pull-up transistor, the dummy transistor also located in the n-well 203, whereby both the pull-up transistor and the dummy transistor participate in protection against an ESD event. The dummy transistor having at least one gate 251, this gate connected through a resistor 260 to the Vdd power supply 240. The n-well 203 connected to the Vdd power supply 240.

13 Claims, 4 Drawing Sheets

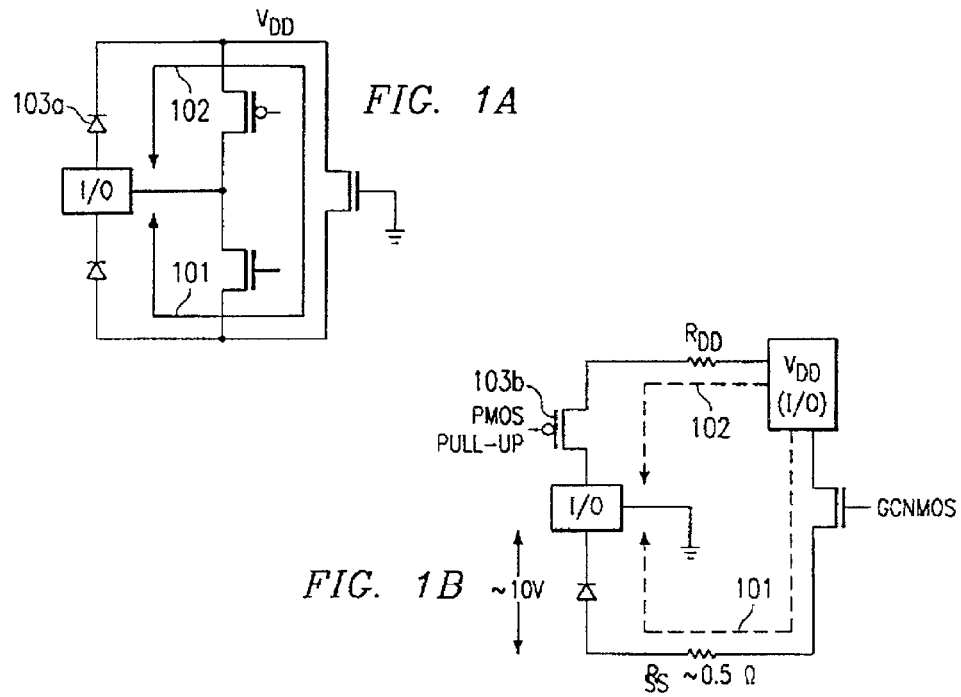
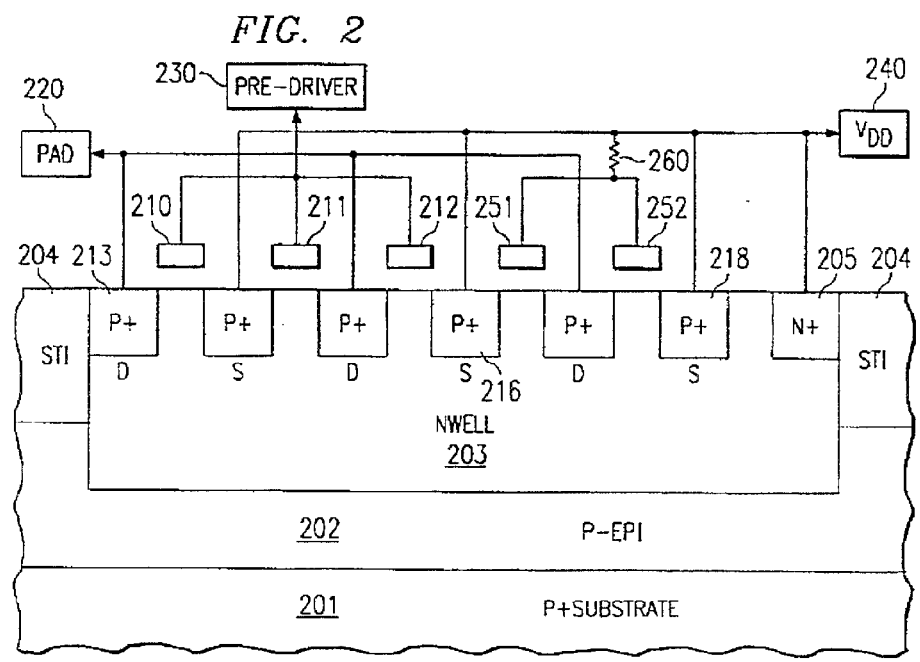

US 6,826,026 B2

OUTPUT BUFFER AND I/O PROTECTION CIRCUIT FOR CMOS TECHNOLOGY

This application claims priority under 35 USC § 119 (e)(1) of provisional application No. 60/318,046 filed Sep. 7, 2001.

FIELD OF THE INVENTION

The present invention is related in general to the field of electronic systems and semiconductor devices and more specifically to the field of electrostatic discharge (ESD) protection for output buffers in deep submicron CMOS technologies.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine nodel", MM); it can generate transients with significantly higher rise times than the HBM ESD source. A third source is described by the "charged device mode" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

With the continued scaling in deep submicron technologies, pMOS transistors are now emerging increasingly with their own failure phenomena. In particular, pMOS transistors are starting to show ESD breakdown behavior resulting in sneak current paths. For example, some products failed at 2.5 to 3.0 kV (and could get worse) and the failure was traced to the small pull-up pMOS in the 2 mA buffers. Thorough analysis indicated that the pMOS transistor triggers unexpectedly and cannot handle the current.

Most of the traditional protection schemes consider the current paths from signal pad to Vss or signal pad to Vdd, but do not consider sneak current paths from Vdd back to the signal pad. This sneak current could happen when an I/O pin is stressed negative to Vdd, or, inversely, a positive stress on Vdd appears with respect to I/O.

An urgent need has, therefore, arisen for a coherent, low-cost method of enhancing ESD insensitivity in pMOS devices without the need for additional, real-estate consuming protection devices. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

As a first embodiment of the present invention, an output circuit is described for improved ESD protection, comprising a pMOS pull-up output transistor connected between a signal (I/O) pad and Vdd power supply, the pull-up transistor located in a n-well and having at least one gate, the gate connected to internal circuitry; a dummy pMOS transistor connected in parallel with the pull-up transistor, the dummy transistor also located in the n-well, whereby both the pull-up transistor and the dummy transistor participate in protection against an ESD event; the dummy transistor having at least one gate, this gate connected through a resistor to the Vdd power supply; and the n-well connected to the Vdd power supply.

Two more embodiments of the invention are described, which are modifications of the first embodiment. One of these embodiments involves a cascode arrangement of the active and the dummy transistor. As the fourth embodiment of the present invention, a device is discussed providing protection against ESD damage of an integrated circuit signal (I/O) pad; the device comprises a pMOS transistor located in an n-well, the transistor having a plurality of gates. The transistor is connected between the I/O pad and Vdd power supply; the plurality of gates are connected through a resistor to the Vdd power supply; and the n-well is connected to internal circuitry, whereby the device is operable as a lateral pnp transistor for ESD stress between the pad and Vdd, applicable for fail-safe operation, where the I/O pad can reach a higher potential than Vdd.

As the fifth embodiment of the present invention, a device is described providing protection against ESD damage of an integrated circuit signal (I/O) pad, comprising a pMOS transistor located in an n-well, the transistor having a plurality of gates. The transistor is connected between the I/O pad and Vss ground potential; the plurality of gates is connected through a resistor to the I/O pad; and the n-well is connected to the I/O pad, whereby the device is operable as a lateral pnp transistor for positive ESD stress to ground potential, and as a substrate diode for negative ESD stress.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A and FIG. 1B are schematic diagrams of a sneak current when an ESD event stresses an I/O pin negative with respect to Vdd.

FIG. 2 is a cross-sectional diagram illustrating the dummy and active pMOS transistors in the I/O protection circuit of the first embodiment of the invention.

FIG. 4A, the first embodiment, shows a dummy pMOS transistor in the same well as the active pMOS transistor, jointly participating under ESD stress to improve the ESD protection.

FIG. 4B, the second embodiment, is varying the diagram in FIG. 4A by omitting the active pMOS Transistor and retaining only the dummy pMOS transistor.

FIG. 4C, the third embodiment, is varying the diagram in FIG. 4A by including a series a stack of active pMOS transistors and dummy pMOS transistors in order to create a cascode.

FIG. 5 illustrates the fourth embodiment of the invention.

DETAILED DESCRIPTION OF THE PREFERRED EMBODIMENTS

The present invention is related to the U.S. Pat. No. 5,986,867, issued on Nov. 16, 1999 (Duvvury et al., "Protection Circuit for Output Drivers"), which is incorporated herewith by reference.

FIGS. 1A and 1B depict schematic circuit diagrams which show the problematic so-called sneak current. As mentioned above, most of the traditional ESD protection schemes consider the current paths from signal pad to Vss, or from signal pad to Vdd, but do not consider "sneak current" paths from Vdd back to the signal pad. This sneak current, however, could happen when an I/O pin is stressed negative to Vdd, or, inversely, when a positive stress on Vdd appears with respect to I/O. The ESD current, as a sneak current, can take path 101 or path 102 in FIGS. 1A and 1B. Usually, path 102 does not occur, because the diode 103a to Vdd blocks it. However, if the pull-up pMOS 103b goes into breakdown as a lateral pnp transistor, the path 102 could cause ESD damage.

The invention avoids these sneak currents and improves ESD performance for advanced CMOS circuits with an improved output buffer design, where a larger than necessary pMOS is designed for the buffer and the unused portion is tied off to act as a dummy. Under ESD conditions, however, the total pMOS would be able to handle the current; the dummy pMOS is sized so that it can tolerate the desired ESD level. Oxide failure is avoided by connecting the gate of the dummy pMOS through a resistor to Vdd or to a tie-high signal generator. The dummy pMOS is integrated in the same well as the active pMOS for improved efficiency. The first, second and third embodiment of the invention are illustrated in FIGS. 2, 3, 4A, 4B, and 4C; the fourth embodiment in FIGS. 5 and 6; and the fifth embodiment in FIGS. 7 and 8.

Figure 3:
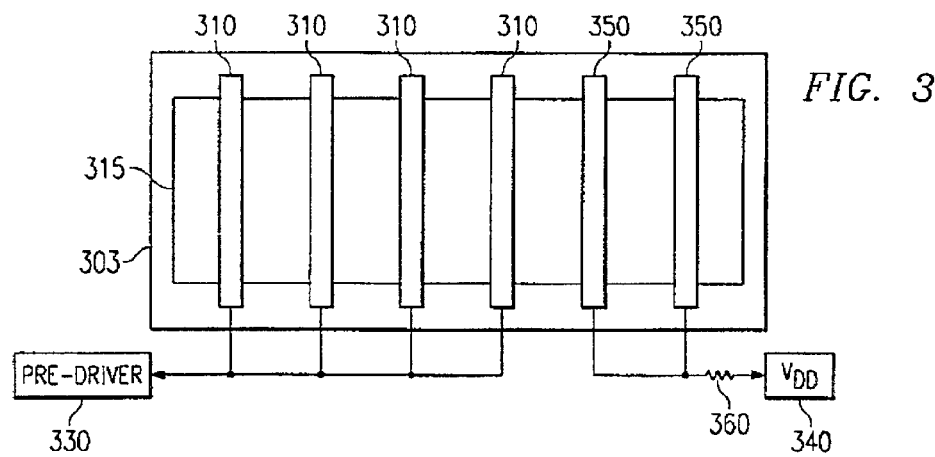
FIG. 3 is a top view of the dummy and active pMOS transistors as arranged in the first ESD protection embodiment of the invention.
Figure 4A:
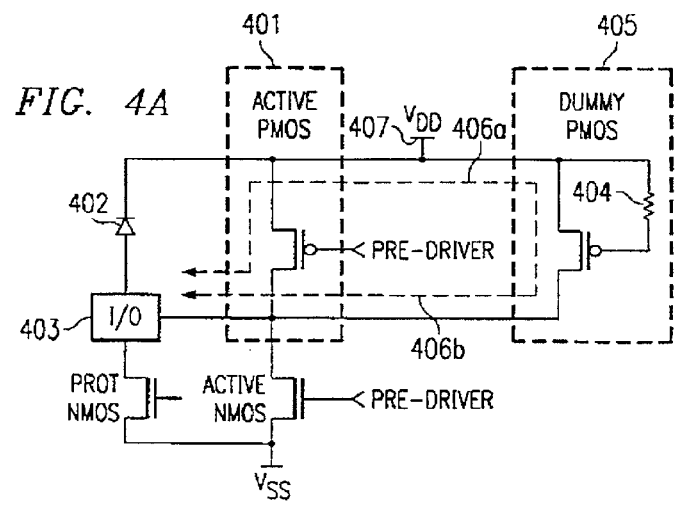
FIGS. 4A, 4B, and 4C are schematic diagrams, which illustrate three related embodiments of the invention.

For illustrating the first embodiment of the invention, FIG. 2 illustrates a schematic cross section of the dummy pMOS transistor within the common n-well; FIG. 3 is a schematic top view of the dummy pMOS gates in relation to the active pMOS gates, and FIG. 4A depicts a schematic circuit diagram of the dummy pMOS transistor in relation to other circuit elements. Referring now to FIG. 2, a p+-type semiconductor substrate 201 has a less p-doped epitaxial layer 202. In this p-epitaxial layer 202, an n-well 203 is formed, confined on the sides by shallow trench isolations 204. The n-well has a contact region 205, which is connected to the Vdd power supply 240. A number of parallel pMOS transistors are formed in the n-well. Each pMOS transistor has source and drain (p+ doped regions) and a gate contact over a gate insulator.

In the example of FIG. 2, three gates 210, 211, and 212 belong to active pMOS transistors (pull-up output transistors) and are electrically connected to internal circuitry (for example, pre-driver) 230. The source of the first of these active transistors is designated 213 and electrically connected to the I/O pad 220. The drain of the last transistor is designated 216 and is electrically connected to Vdd power supply terminal 240.

In the example of FIG. 2, two gates 251 and 252 belong to dummy pMOS transistors and are electrically connected to the Vdd terminal 240 through a resistor 260 (alternatively, they could be connected directly to an active Tie-Hi signal generator). The dummy transistors are connected in parallel with the active pull-up transistors; the source of the first dummy transistor is the source 216 of the last active transistor. The source of the last dummy transistor is designated 218.

Since the pull-up transistors as well as the dummy transistors are located in the n-well 203, both the dummy transistors and the pull-up transistors participate in protection against an ESD event. Specifically, the dummy pMOS transistors prevent damage from any sneak current passing from Vdd 240 back to the signal pad 220 by sharing the current. On the other hand, due to their electrical connections, only the active transistor gates 210, 211, and 212 participate in circuit functions, but not the dummy transistor gates 251 and 252.

FIG. 3 shows a schematic top view of the active and dummy pMOS transistors in the layout of the first ESD protection embodiment of the invention. A number of p+ diffusions 315, embedded in the n-well 303, are arranged as sources and drains of MOS transistors. Several gates 310 between these p+ diffusions are used as active pMOS gates, while other gates 350 form dummy pMOS gates. The gates 310 of active transistors are electrically connected to internal circuitry such as pre-driver 330, while the gates 350 of the dummy transistors are connected through resistor 360 to Vdd power supply 340.

Figure 4B:
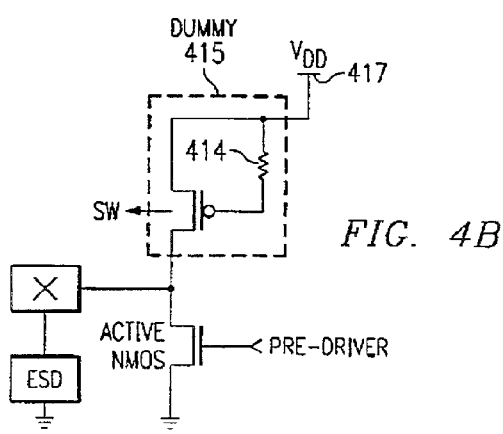
Figure 4C:
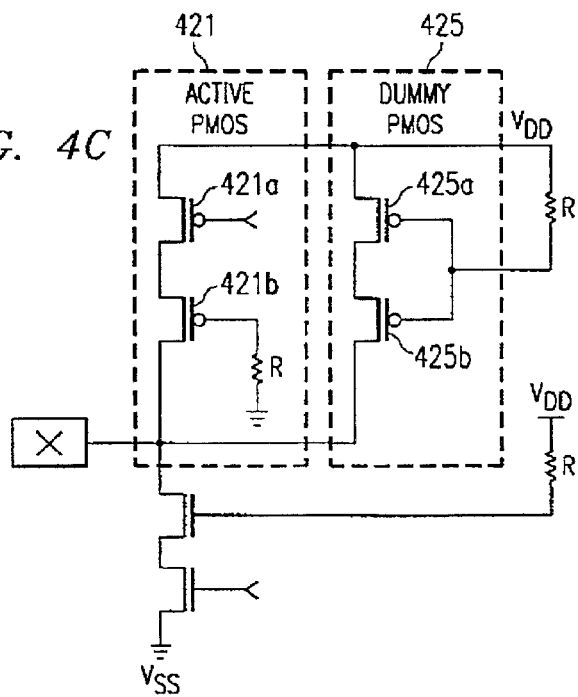

Three closely related embodiments of the invention are displayed in the schematic circuit diagrams of FIGS. 4A, 4B, and 4C. FIG. 4A illustrates the design solution of the first embodiment of the invention to improve ESD protection. The active pMOS transistor 401 is electrically connected through protective diode 402 to the I/O pad 403. The dummy pMOS transistor, together with resistor 404, is designated 405, and through resistor 404 connected to Vdd terminal 407. Without the dummy pMOS 405, a damaging level of sneak current path 406a or 406b from Vdd terminal 407 back to the signal pad 403 would be possible. The insert of the dummy pMOS of the invention, though, improves the handling capacity for the sneak currents. This concept can be employed genera ly for pMOS protection devices, even when a large transistor has its gate resistively tied to a power supply.

The second embodiment of the invention, displayed in the schematic circuit diagram of FIG. 4B, derives from the first embodiment by omitting the active pMOS transistor 401 of FIG. 4A and retaining only the dummy pMOS transistor, designated 415. Again, transistor 415 is connected through resistor 414 to VDD terminal 417.

The third embodiment of the invention is based on the concept of a cascode, wherein two or more transistors are stacked, or connected in series. Using the cascode solution, higher signal voltages can be handled than the technology is actually providing for a single transistor. FIG. 4C depicts a cascode embodiment of the invention based on two transistors in series, but it should be understood that the invention applies also to designs of more than two transistors. As can be seen in FIG. 4C, both the active pMOS 421 as well as the dummy pMOS 425 contain two transistors, 421a and 421b, and 425a and 425b, respectively.

Figure 5:
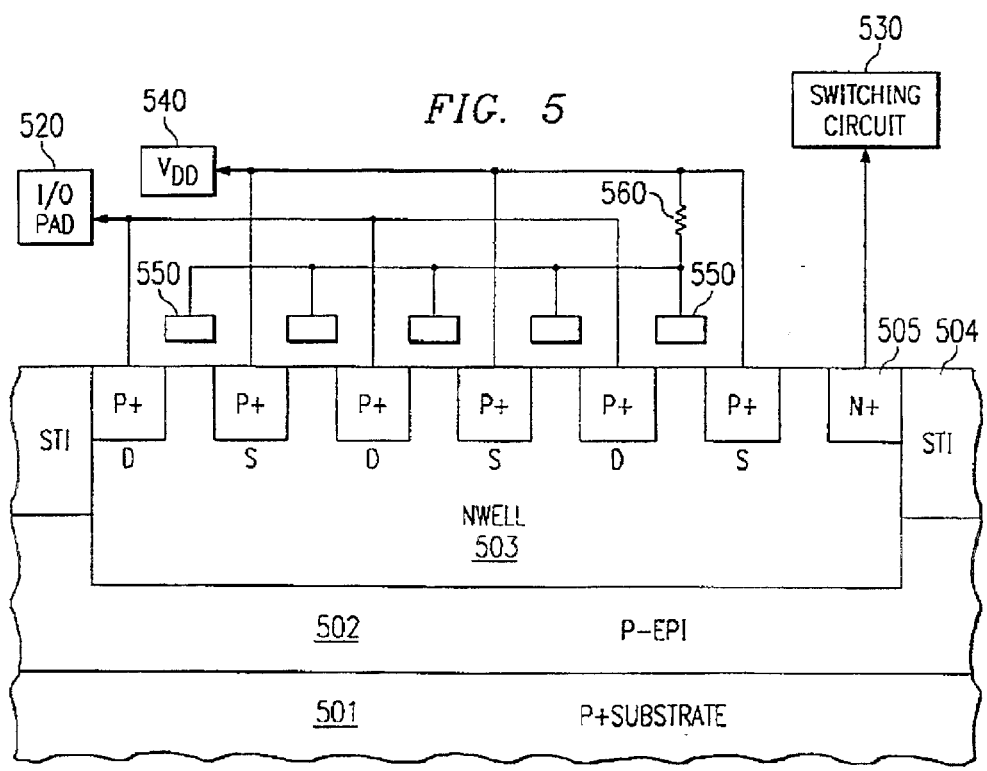
FIG. 5 is a cross-sectional diagram illustrating the all-dummy pMOS transistor in the I/O protection circuit.

FIG. 5 illustrates a schematic cross section of the fourth embodiment of the invention, a device providing protection against ESD damage of an IC signal or I/O pad 520. A p+-type semiconductor substrate 501 has a less p-doped epitaxial layer 502. In this p-epitaxial layer 502, an n-well 503 is formed, confined on the sides by shallow trench isolations 504. The n-well has a contact region 505, which is connected to a switching circuit 530.

A multi-finger pMOS transistor is formed in n-well 503 so that it has a plurality of gates 550. The pMOS transistor is connected between the I/O pad 520 and the Vdd power supply 540. As FIG. 5 shows, this connection is accomplished by alternatively connecting the p+ regions of the transistor to I/O pad 520 and Vdd terminal 540. The plurality of gates 550 is connected through a resistor 560 to Vdd power supply 540; gates 550 are operable as dummy gates. The resistor 560 will help reduce the stress across the gate oxides during ESD transients. Due to the connectivity of the pMOS transistor, the device is operable as a lateral pnp transistor for ESD stress between I/O pad 520 and Vdd terminal 540. It can be applied for fail-safe operation, where the I/O pad 520 can reach a higher potential than Vdd.

Figure 6:
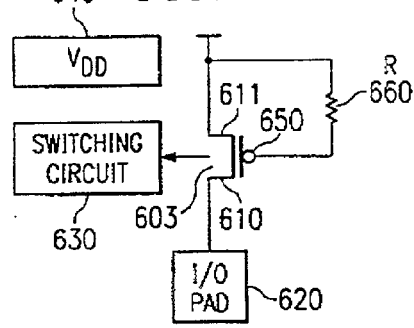
FIG. 6 is a schematic diagram of the fourth I/O protection embodiment of the invention.

FIG. 6 is a schematic circuit diagram of the connectivity of the dummy pMOS transistor in the fourth embodiment of the invention. The drain 610 of the multi-finger pMOS transistor is connected to I/O pad 620, the source 611 to Vdd terminal 640, the gate 650 through resistor 660 to Vdd terminal 640, and the body (n-well) 603 to switching circuit 630.

Figure 7:
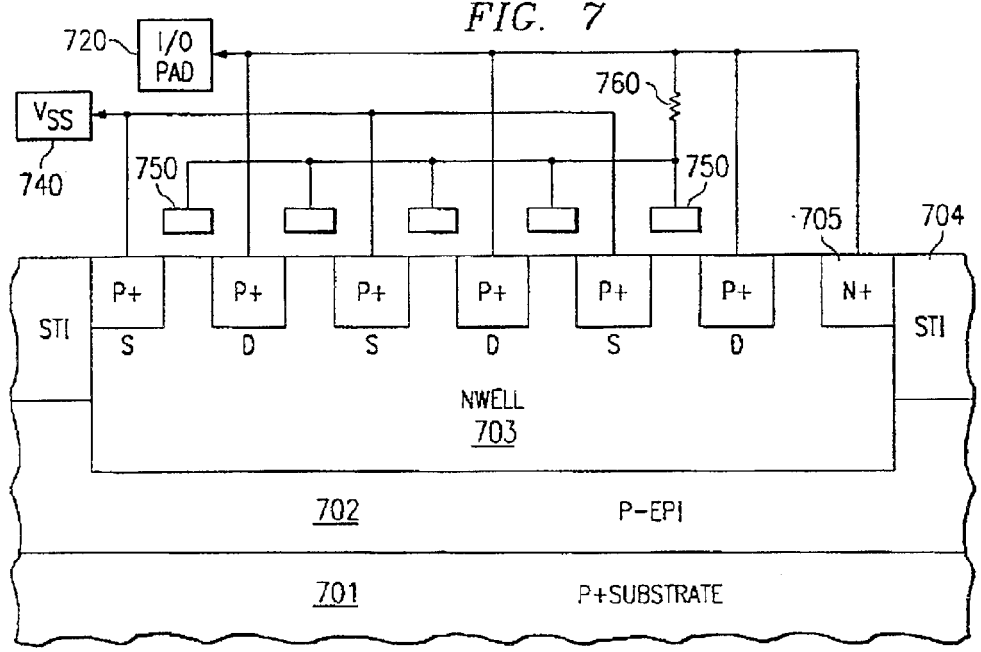
FIG. 7 is a cross-sectional diagram illustrating the all-dummy pMOS transistor in the I/O protection circuit of the fifth embodiment of the invention.

FIG. 7 illustrates a schematic cross section of the fifth embodiment of the invention, a device providing protection against ESD damage of an IC signal or I/O pad 720. A p+-type semiconductor substrate 701 has a less p-doped epitaxial layer 702. In this p-epitaxial layer 702, an n-well 703 is formed, confined on the sides by shallow trench isolations 704. The n-well has a contact region 705, which is connected to the I/O pad 720.

A multi-finger pMOS transistor is formed in n-well 703 so that it has a plurality of gates 750. The pMOS transistor is connected between the I/O pad 720 and the Vss ground terminal 740. As FIG. 7 shows, this connection is accomplished by alternatively connecting the p+ regions of the transistor to I/O pad 720 and Vss terminal 740. The plurality of gates 750 is connected through a resistor 760 to the I/O pad 720; gates 750 are operable as dummy gates. The resistor 760 will help reduce the stress across the gate oxides during ESD transients. Due to the connectivity of the pMOS transistor, the device is operable as a lateral pnp transistor for positive ESD stress to ground potential, and as a substrate diode (from the n-well contact) for negative ESD stress.

Figure 8:
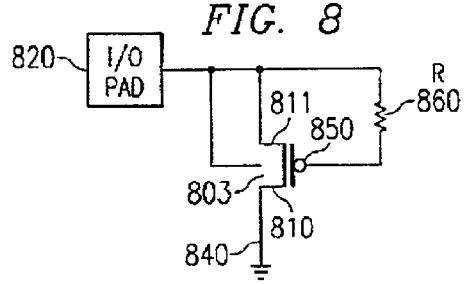
FIG. 8 is a schematic diagram of the fifth I/O protection embodiment of the invention.

FIG. 8 is a schematic circuit diagram of the connectivity of the dummy pMOS transistor in the fifth embodiment of the invention. The source 810 of the multi-finger pMOS transistor is connected to Vss ground terminal 840, the drain 811 to I/O pad 820, the gate 850 through resistor 860 to I/O pad 820, and the body (n-well) 803 to the I/O pad 820.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An output circuit, improved for ESD protection, comprising:
    a pMOS pull-up output transistor connected between a signal (I/O) pad and Vdd power supply, said pull-up transistor located in an n-well and having at least one gate, said gate connected to internal circuitry;
    a dummy pMOS transistor connected in parallel with said pull-up transistor, said dummy transistor also located in said n-well, whereby both said pull-up transistor and said dummy transistor participate in protection against an ESD event;
    said dummy transistor having at least one gate, said gate connected through a resistor to said Vdd power supply; and
    said n-well connected to said Vdd power supply.

2. The circuit according to claim 1 wherein said pMOS pull-up output transistor is connected to said signal pad through a protective diode.

3. The circuit according to claim 1 wherein said at least one dummy transistor gate is connected either to Vdd through a resistor or to an active tie-hi signal generator.

4. The circuit according to claim 1 wherein said dummy pMOS transistor prevents damage from any sneak current passing from VDD back to said signal pad.

5. The circuit according to claim 1 wherein only said at least one active transistor gate participates in circuit functions, but not said at least one dummy transistor gate.

6. The circuit according to claim 1 wherein said pMOS pull-up output transistor comprises two or more pMOS transistors stacked in series in order to provide a cascode for higher voltage handling capability.

7. The circuit according to claim 1 wherein said dummy pMOS transistor comprises two or more pMOS transistors stacked in series in order to provide a cascode for higher voltage handling capability.

8. A device providing protection against ESD damage of an integrated circuit signal (I/O) pad, comprising:

a pMOS transistor located in a n-well, said transistor having a plurality of gates;

said transistor connected between said I/O pad and Vdd power supply;

said plurality of gates connected through a resistor to said Vdd power supply; and said n-well connected to internal circuitry, whereby said device is operable as a lateral pnp transistor for ESD stress between said pad and Vdd, applicable for fail-safe operation, where said I/O pad can reach a higher potential than Vdd.

9. The device according to claim 8 wherein said resistor provides reduction of stress across the oxide layer of said plurality of gates during ESD transients.

10. The device according to claim 8 wherein said plurality of gates is operable as dummy gates.

11. A device providing protection against ESD damage of an integrated circuit signal (I/O) pad, comprising:

a pMOS transistor located in a n-well, said transistor having a plurality of gates;

said transistor connected between said I/O pad and Vss ground potential;

said plurality of gates connected through a resistor to said I/O pad; and said n-well connected to said I/O pad;

whereby said device is operable as a lateral pnp transistor for positive ESD stress to ground potential, and as a substrate diode for negative ESD stress.

12. The device according to claim 11 wherein said resistor provides reduction of stress across the oxide layer of said plurality of gates during ESD transients.

13. The device according to claim 8 wherein said plurality of gates is operable as dummy gates.

* * * * *